(12) United States Patent
Oh et al.

(10) Patent No.: US 7,923,118 B2
(45) Date of Patent: Apr. 12, 2011

(54) ETCHING TAPE AND METHOD OF FABRICATING ARRAY SUBSTRATE FOR LIQUID CRYSTAL DISPLAY USING THE SAME

(75) Inventors: Jae Young Oh, Gyeonggi-do (KR); Soo Pool Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 16 days.

(21) Appl. No.: 12/320,126

(22) Filed: Jan. 16, 2009

(65) Prior Publication Data
US 2009/0136772 A1 May 28, 2009

Related U.S. Application Data

(62) Division of application No. 11/455,715, filed on Jun. 20, 2006, now Pat. No. 7,498,209.

(30) Foreign Application Priority Data

Aug. 24, 2005 (KR) .................. 10-2005-0077742

(51) Int. Cl.
*B32B 15/04* (2006.01)
*B32B 23/04* (2006.01)
*B32B 27/08* (2006.01)
*B32B 27/32* (2006.01)
*B32B 27/36* (2006.01)

(52) U.S. Cl. ........ 428/457; 428/480; 428/500; 428/522; 428/523; 428/532; 428/688; 252/79.1; 252/79.2; 252/79.3; 216/41; 216/83; 216/96; 216/99; 216/100; 216/108; 216/109

(58) Field of Classification Search .................. None
See application file for complete search history.

(56) References Cited

U.S. PATENT DOCUMENTS

| 1,470,772 | A | * | 10/1923 | Simon ................... 252/79.3 |
| 2,067,925 | A | * | 1/1937 | Clayton-Kennedy ........ 252/79.3 |
| 3,664,913 | A | * | 5/1972 | Ratcliff ................ 156/345.3 |
| 4,448,637 | A | * | 5/1984 | Hiraishi et al. .............. 216/23 |
| 4,552,614 | A | * | 11/1985 | Beckett ..................... 216/92 |
| 5,300,172 | A | * | 4/1994 | Ishiwata et al. ........... 156/275.5 |
| 5,688,366 | A | * | 11/1997 | Ichinose et al. ............. 438/754 |
| 6,300,152 | B1 | | 10/2001 | Kim |
| 6,300,234 | B1 | | 10/2001 | Flynn et al. |
| 6,379,573 | B1 | | 4/2002 | Kim et al. |

(Continued)

FOREIGN PATENT DOCUMENTS

CN    1209421    *    3/1999

(Continued)

OTHER PUBLICATIONS

Machine translation of DE 4112517 A1 (2009).*

*Primary Examiner* — Vivian Chen
(74) *Attorney, Agent, or Firm* — Morgan, Lewis & Bockius LLP

(57) ABSTRACT

A method of fabricating a liquid crystal display array substrate includes forming a gate wiring line having a gate pad electrode, forming a data wiring line having a data pad electrode, forming a protection layer over the gate pad electrode and the data pad electrode, and positioning etching tapes on the protection layer over the gate pad electrode and the data pad electrode.

3 Claims, 6 Drawing Sheets

U.S. PATENT DOCUMENTS

| | | | | |
|---|---|---|---|---|
| 7,129,109 B2 | * | 10/2006 | Munzer et al. | 438/98 |
| 7,196,018 B2 | * | 3/2007 | Szlufcik et al. | 438/745 |
| 7,498,209 B2 | * | 3/2009 | Oh et al. | 438/151 |
| 2003/0160026 A1 | * | 8/2003 | Klein et al. | 216/83 |
| 2004/0242019 A1 | * | 12/2004 | Klein et al. | 438/757 |
| 2005/0247674 A1 | * | 11/2005 | Kubelbeck et al. | 216/92 |
| 2006/0151434 A1 | * | 7/2006 | Deem et al. | 216/83 |

FOREIGN PATENT DOCUMENTS

| | | | |
|---|---|---|---|
| CN | 1277944 | * | 12/2000 |
| DE | 41 12 517 A1 | * | 10/1991 |
| DE | 102 41 300 A1 | * | 3/2004 |
| GB | 1 572 032 | * | 7/1980 |
| JP | 60-226930 A | | 11/1985 |
| JP | 2003-002685 | * | 1/2003 |

* cited by examiner

ETCHING TAPE AND METHOD OF FABRICATING ARRAY SUBSTRATE FOR LIQUID CRYSTAL DISPLAY USING THE SAME

This application is a divisional of U.S. patent application Ser. No. 11/455,715 filed on Jun. 20, 2006, U.S. Pat. No. 7,498,209, and claims the benefit of Korean Patent. Application No. 2005-0077742, filed on Aug. 24, 2005, both of which are hereby incorporated by reference in their entirety.

BACKGROUND OF THE INVENTION

1. Field of the Invention

The present invention relates to etching, and more particularly, an etching tape and a method of fabricating an array substrate for a liquid crystal display (LCD) using the same. Although the present invention is suitable for a wide scope of applications, it is particularly suitable for performing a low cost etching process in a method of fabricating an array substrate for an LCD.

2. Description of the Related Art

In the information-oriented society, the role of electronic displays is important since various types of electronic displays are widely used. As electronic displays evolve, new functions for various needs of the information-oriented society are continuously being added. In general, the electronic displays convey information to human beings through visual images. In other words, electronic displays change electronic information signals output from various electronic apparatuses into optical information signals that can be seen by human eyes to communicate information to human beings.

Electronic displays can be an emission type display in which the optical information signals are displayed by light emission from the display or a light reception type display in which the optical information signals are displayed by optical modulation of light passing through the display. Examples of emission type displays, also referred to as active displays, include cathode ray tubes (CRTs), plasma display panels (PDP), organic electroluminescent displays (OELD), and light emitting diodes (LED). Examples of light reception type displays, also referred to as passive displays, include liquid crystal displays (LCD) and electrophoretic image displays (EPID). CRTs have been used in televisions and computer monitors for a long time and have a large market share due to their low cost. However, the CRTs have disadvantages, such as heavy weight, large bulk, and high power consumption.

The use of flat panel displays (FPD) is rapidly increasing because they are thinner, lighter and consume a relatively small amount of power. Examples of FPDs include LCDs, plasma display panels (PDP), and organic electroluminescence displays (OELD). In an LCD, a liquid crystal material having an anisotropic dielectric constant is injected between a color filter substrate and an array substrate. The color filter substrate includes a common electrode, color filters, and black matrix. The array substrate includes switching devices and pixel electrodes connected to the switching devices. To operate the LCD, different electric potentials are applied to the pixel electrodes and the common electrode so that the intensity of the electric field formed across the liquid crystal material controls the orientation of the liquid crystal the molecules of the liquid crystal material, so as to control the amount of light that passes through the array substrate to display a desired image. Typically, thin film transistors (TFTs) are used in the LCDs.

A related art LCD array substrate is fabricated through four photolithography and etching processes using four different masks or five photolithography and etching processes using five different masks. The photolithography processes require a large amount of time and cost to fabricate the related art LCD array substrate. To reduce the time and cost for fabricating the LCD array substrate, a method of fabricating an LCD array substrate having less photolithography processes is desirable.

SUMMARY OF THE INVENTION

Accordingly, the present invention is directed to an etching tape and a method of fabricating an array substrate for a liquid crystal display that substantially obviate one or more of the problems due to limitations and disadvantages of the related art.

An object of the present invention to provide an etching tape to perform etching processes without performing photolithography processes.

Another object of the present invention to provide a method of fabricating a liquid crystal display (LCD) using an etching tape.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an etching tape includes a base sheet, and an etching material layer on the base sheet, wherein the etching material is a gel type etching material.

In another aspect, a method of fabricating a liquid crystal display array substrate includes forming a gate wiring line having a gate pad electrode, forming a data wiring line having a data pad electrode, forming a protection layer over the gate pad electrode and the data pad electrode, and positioning etching tapes on the protection layer over the gate pad electrode and the data pad electrode.

In another aspect, a method of fabricating a liquid crystal display array substrate includes forming a gate electrode, a first electrode of a storage capacitor, and a gate wiring line on a transparent insulating substrate, forming a gate insulating layer, an active layer, ohmic contact layers, a source electrode, and a drain electrode on the gate electrode, forming dielectric layers and the second electrode of the storage capacitor on the first electrode of the storage capacitor, forming a data wiring line, forming a pixel electrode on the drain electrode and the second electrode of the storage capacitor, forming a gate pad electrode on the gate wiring line, and forming a data pad electrode on the data wiring line, forming a protection layer over the gate pad electrode and the data pad electrode, and etching the protection layer using an etching tape to form contact holes in the protection layer over the gate pad electrode and the data pad electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF PREFERRED EMBODIMENTS

Figure 1:
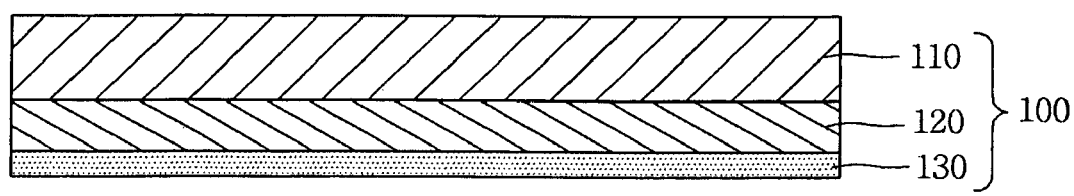
FIG. 1 is a cross-sectional view of an etching tape according to an embodiment of the present invention.

Reference will now be made in detail to the preferred embodiments of the present invention, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements.

FIG. 1 is a cross-sectional view of an etching tape according to an embodiment of the present invention. As shown in FIG. 1, the etching tape 100 according to an embodiment of the present invention includes a base sheet 110, an etching material layer 120, and a protection sheet 130. The etching material layer 120 is a gel type etching material which is coated onto the base sheet 110. One of a cellophane film, a polymer resin film, and a steel use stainless (SUS) film that is chemically stable and that can be effectively coated with a gel type etching material is suitable for use as the base sheet 110.

Since the etching material layer 120 is a gel type etching material coated onto the base sheet 110, the etching material layer 120 can be accurately positioned on a region to be etched. In other words, a region can be etched without the gel type etching material affecting other regions, which are not to be etched. Thus, etching can be effectively performed without performing a photolithography process, which use masks.

A material that can be etched by such an etching process using the etching material layer 120 is, for example, $SiN_x$. The etching material that etches $SiN_x$ is applied to the base sheet 120 to form the etching material layer 120. In this example, the etching material can be one of $NH_4HF$ and KOH with a gel-like consistency. Then, a protection sheet 130 is positioned on the etching material layer 120 to prevent the gel type etching material layer 120 from reacting with the external environment and to prevent impurities from entering into the etching material layer 120. The protection sheet 130 may be made of a polyethylene terephthalate (PET) film, a polyvinylchloride (PVC) film, a polyethylene (PE) film, or a polypropylene (PP) film. When the etching process is performed, the protection sheet 130 is removed, so that the etching material layer 120 can be directly positioned on a region to be etched.

Figure 2:
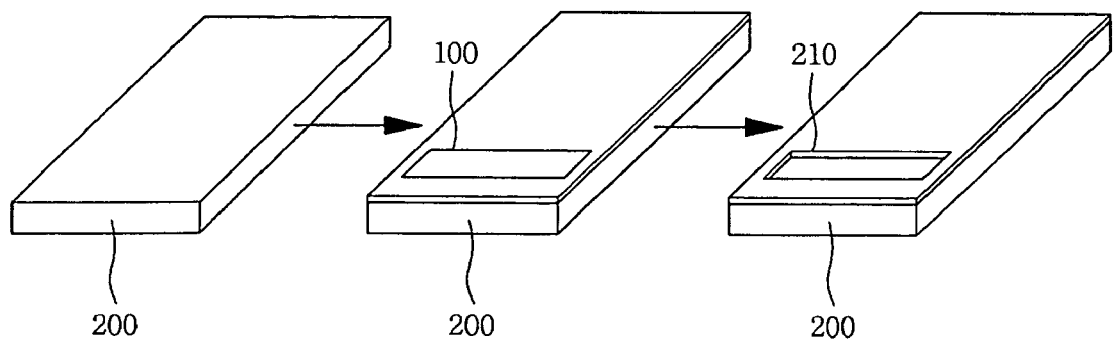
FIG. 2 is a view illustrating an etching process using the etching tape according to an embodiment of the present invention.

FIG. 2 is a view illustrating an etching process using the etching tape according to an embodiment of the present invention. First, as illustrated in FIG. 2, the protection sheet 130 of the etching tape 100 is removed and the etching material layer 120 is directly positioned on a region 210 to be etched of a material layer 200. To sufficiently etch the region 210, the etching material layer 120 of the etching tape 100 is positioned on the region 210 for a period of 1 to 60 minutes.

Next, the etching tape 100 is removed and any remaining etching material is washed away using deionized water (DI water). Then, the DI water is dried using an air knife.

When the etching process is performed using the etching tape 100 according to the embodiment of the present invention, the etching tape 100 is directly positioned on the region 210 to be etched to perform the etching process. Similarly, other etching processes can also be formed in lieu of the photolithography processes, which use different masks. Thus, the time and cost required for the etching process is reduced.

Figure 3:
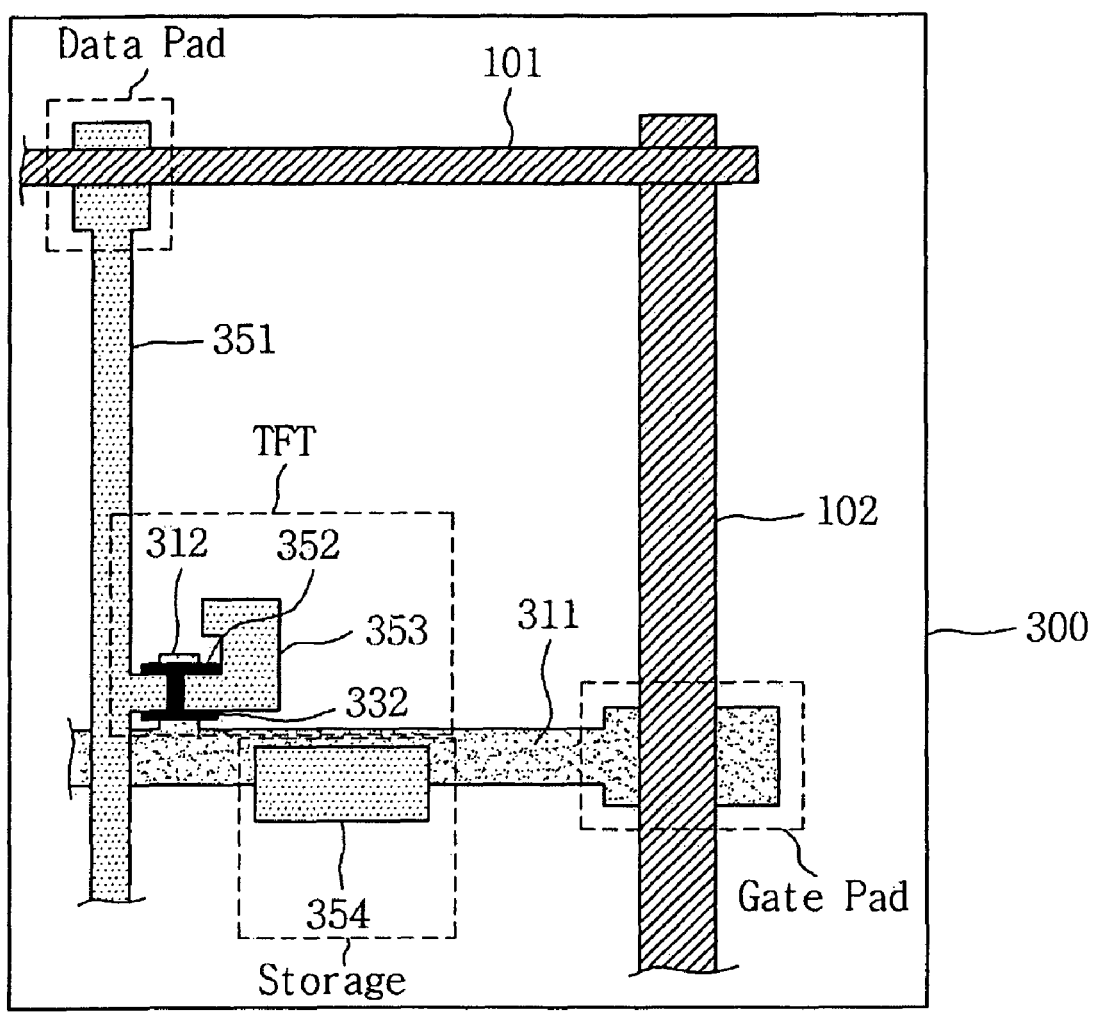
FIG. 3 is a plan view of a liquid crystal display (LCD) array substrate for describing a method of fabricating an LCD array substrate using the etching tape according to an embodiment of the present invention.

Hereinafter, a method of fabricating a liquid crystal display (LCD) array substrate using the etching tape according to an embodiment of the present invention will be described in detail with reference to FIGS. 3 and 4A to 4G. FIG. 3 is a plan view of a liquid crystal display (LCD) array substrate for describing a method of fabricating an LCD array substrate using the etching tape according to an embodiment of the present invention. FIGS. 4A to 4G are cross-sectional views illustrating processes of fabricating the LCD array substrate using the etching tape according to an embodiment of the present invention.

Referring to FIG. 3, a gate wiring line 311 and a data wiring line 351 are arranged to cross each other on a transparent insulating substrate 300. A gate pad is formed at an end of the gate wiring line 311 and a data pad is formed at an end of the data wiring line 351. A thin film transistor (TFT), including a gate electrode 312, an active layer 332, a source electrode 352, and a drain electrode 353, is formed at the crossing of the gate wiring line 311 and the data wiring line 351. A storage capacitor electrode 354 is formed over the gate wiring line 311 to form a storage capacitor.

Figure 4A:
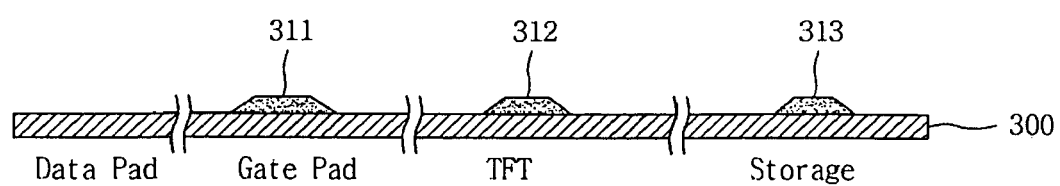
FIGS. 4A to 4G are cross-sectional views illustrating processes of fabricating the LCD array substrate using the etching tape according to an embodiment of the present invention.

In the method of fabricating the LCD array substrate using the etching tape according to the embodiment of the present invention, the gate pad and the data pad may be formed using etching tapes 101 and 102. First, a metal material, including Al or Cu, is deposited on the transparent insulating substrate 300 and a photolithography process using a first mask and a first etch process are performed to pattern the metal material. As a result, the gate wiring line 311 is formed in the gate pad region, the gate electrode 312 is formed in the TFT region, and the first electrode 313 of the storage capacitor is formed in the storage capacitor region, as illustrated in FIG. 4A.

Figure 4B:
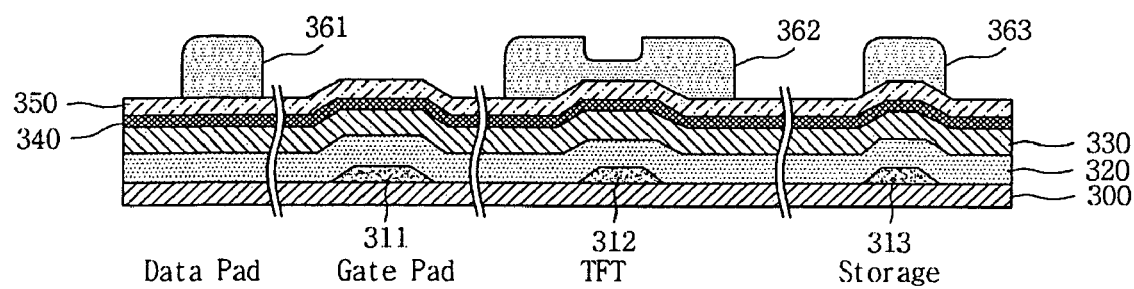
Figure 4C:
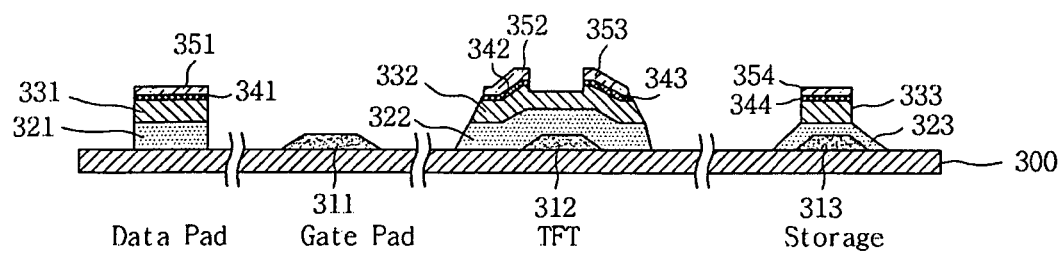

Next, as illustrated in FIG. 4B, an insulating layer, 320 such as SiNx, an amorphous silicon layer 330, an amorphous silicon layer 340 doped with impurities, and a metal material layer 350, including Cr or Mo, are sequentially deposited. Then these layers are patterned by a photolithography process using a second mask and a second etching process using photoresist patterns 361, 362, and 363. As a result, an insulating layer 321, semiconductor layers 331 and 341, and the data wiring line 351 are formed in the data pad region, a gate insulating layer 322, an active layer 332, ohmic contact layer 342 and 343. A source electrode 352, and a drain electrode 353 are formed on the gate electrode 312 in the TFT region. Dielectric layers 323, 333, and 344 and the second electrode 354 of the storage capacitor are formed on the first electrode 313 of the storage capacitor in the storage capacitor region, as illustrated in FIG. 4C. The photoresist pattern 362 is formed using a diffraction (half tone) mask and the gate insulating layer 322, the active layer, the ohmic contact layers 342 and 343, the source electrode 352, and the drain electrode 353 can be simultaneously formed using the photoresist pattern 362.

The gate insulating layer 322, the active layer 332, the ohmic contact layers 342 and 343, the source electrode 352, and the drain electrode 353 are not necessarily formed and may be formed in two photolithography processes when the diffraction (halftone) mask is not used.

Figure 4D:
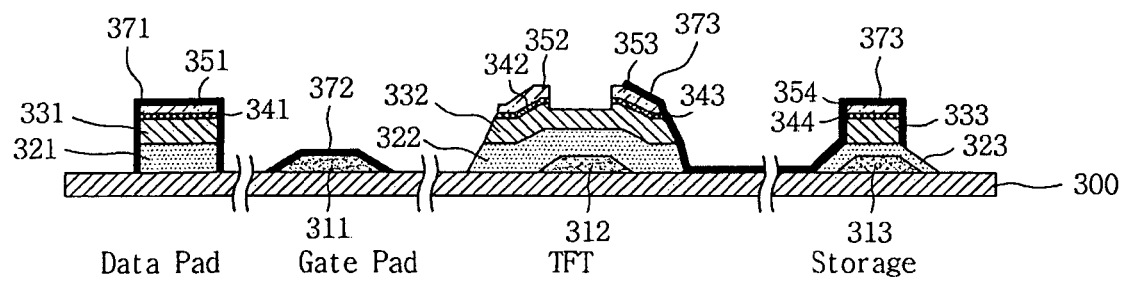

Next, a transparent conductive material, such as indium tin oxide (ITO) or indium zinc oxide (IZO), is deposited and the transparent conductive material is patterned by a photolithography process using a third mask and a third etching process. As a result, a pad electrode is formed on the data wiring line 351 in the data pad region, a gate pad electrode 372 is formed on the gate wiring line 311 in the gate pad region, and a pixel electrode 373 is formed on the drain electrode 353 and the second electrode 354 of the storage capacitor in the TFT region and the storage capacitor region, as illustrated in FIG. 4D.

Figure 4E:
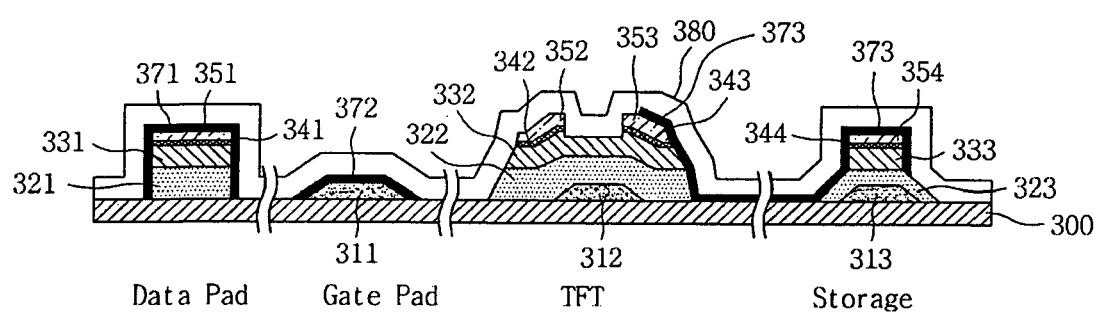

Next, $SiN_x$ is deposited to form a protection layer 380, as illustrated in FIG. 4E.

Figure 4F:
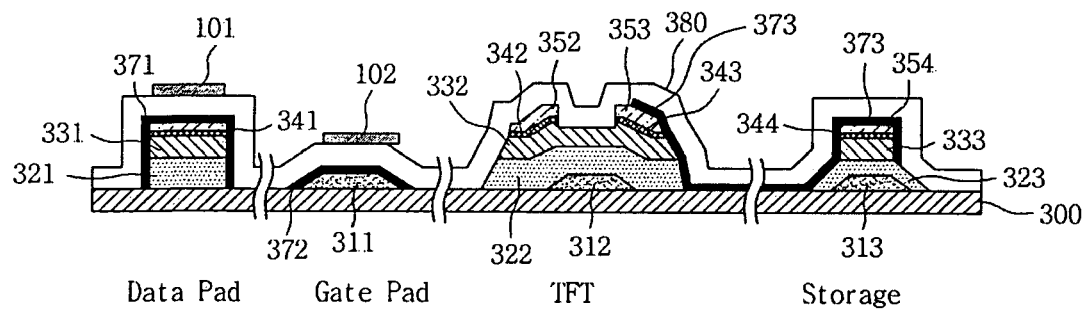

As illustrated in FIG. 4F, the protection layer 380 formed on the data pad electrode 371 of the data pad region and on the gate pad region 372 of the gate pad region is then etched using the etching tape. More specifically, etching tapes 101 and 102 are positioned on the protection layer 380 formed on the data pad electrode 371 in the data pad region and on the protection layer 380 formed on the gate pad electrode 372 in the gate pad region for a period of 1 to 60 minutes. Each of the etching tapes 101 and 102 includes a base sheet and an etching material layer as described above. The base sheet may be made of one of a cellophane film, polymer resin film, and steel use stainless (SUS) film. The etching material of the etching material layer for etching $SiN_x$ may be made of one of NH4HF and KOH.

Figure 4G:
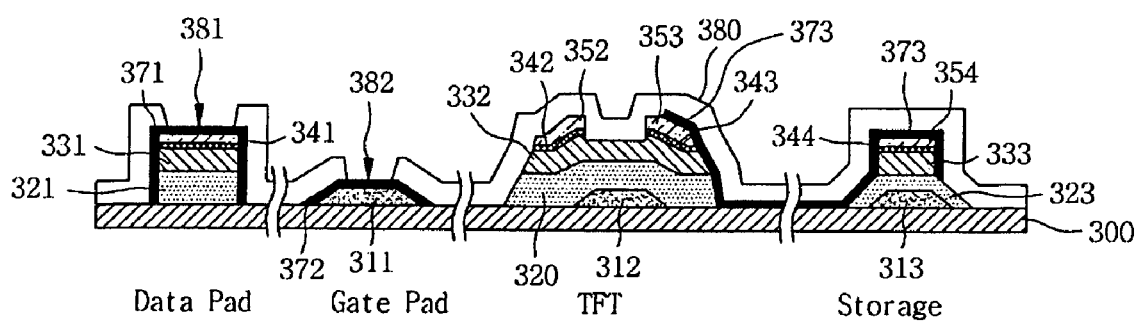

Next, the etching tapes 101 and 102 are removed and any remaining etching material is washed away using deionized water (DI water). Then, the DI water is dried using an air knife. As illustrated in FIG. 4G, portions of the protection layer 380 formed on the data pad electrode 371 in the data pad region and the protection layer 380 formed on the gate pad electrode 372 in the gate pad region are removed to form contact holes 381 and 382.

When the etching process is performed using the above-described etching tape according to the embodiment of the present invention, since the etching tape is directly positioned on the region to be etched, it is not necessary to perform a photolithography process, which uses a mask so that the time and costs for the etching process are reduced. Also, in the method of fabricating the LCD array substrate using the etching tape according to the embodiment of the present invention, an etching process using the above-described etching tape reduces the time and cost required for the fabrication of an LCD array substrate.

It will be apparent to those skilled in the art that various modifications and variations can be made in the etching tape and a method of fabricating an array substrate for a liquid crystal display (LCD) using the same of the present invention without departing from the spirit or scope of the invention. Thus, it is intended that the present invention cover the modifications and variations of this invention provided they come within the scope of the appended claims and their equivalents.

What is claimed is:

1. An etching tape for fabricating an array substrate for a liquid crystal display comprising:
    a base sheet; and
    an etching material layer formed on an entire surface of the base sheet, wherein the etching material is a gel type NH4HF capable of etching SiNx, wherein the base sheet is one of a cellophane film, a polymer resin film, or a steel use stainless film.

2. The etching tape as claimed in claim 1, further comprising a protection sheet positioned on the etching material layer.

3. The etching tape as claimed in claim 2, wherein the protection sheet is one of a poly ethylene terephthalate (PET) film, a poly vinyl chloride (PVC) film, a poly ethylene (PE) film, or a poly propylene (PP) film.

* * * * *